(12) United States Patent
Puri et al.

(10) Patent No.: US 6,601,223 B1
(45) Date of Patent: Jul. 29, 2003

(54) SYSTEM AND METHOD FOR FAST INTERCONNECT DELAY ESTIMATION THROUGH ITERATIVE REFINEMENT

(75) Inventors: Ruchir Puri, New Rochelle, NY (US); David S. Kung, Chappaqua, NY (US); Anthony Drumm, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 09/675,634

(22) Filed: Sep. 29, 2000

(51) Int. Cl.[7] ............................................. G06F 17/50
(52) U.S. Cl. ..................... 716/6; 716/1; 716/2; 716/4; 716/5
(58) Field of Search ............................. 716/6, 5, 2, 4, 716/1

(56) References Cited

U.S. PATENT DOCUMENTS

| | | | | |
|---|---|---|---|---|
| 5,617,325 A | * | 4/1997 | Schaefer | 703/19 |
| 5,675,502 A | * | 10/1997 | Cox | 703/13 |
| 5,841,672 A | * | 11/1998 | Spyrou et al. | 716/6 |
| 5,872,717 A | | 2/1999 | Yu et al. | 364/489 |
| 6,014,510 A | | 1/2000 | Burks et al. | 395/500.4 |
| 6,047,117 A | | 4/2000 | Kahng et al. | 395/500.34 |
| 6,314,546 B1 | * | 11/2001 | Muddu | 716/5 |
| 6,347,393 B1 | * | 2/2002 | Alpert et al. | 716/2 |

OTHER PUBLICATIONS

Quin et al "Modeling the "Effective Capacitance" for the RC Interconnect of CMOS Gates", IEEE, 1994.*

Arunachalam et al "CMOS Gate Delay Models for General RLC Loading", IEEE, 1997.*

Kahng, Andrew B., et al., *Delay Models for MCM Interconnects when Response is Non–Monotone*, IEEE, pp. 102–107, (1997).

Mecha, H., et al., *Interconnection Delay and Clock Cycle Selection in High Level Synthesis*, IEEE, pp. 504–505, (1996).

* cited by examiner

Primary Examiner—Matthew Smith
Assistant Examiner—Brandon Bowers
(74) Attorney, Agent, or Firm—Dilworth & Barrese, LLP (57) ABSTRACT

A system and method are proposed for estimating interconnect delay in an Integrated Circuit (IC). A formula for effective capacitance is derived which considers the effect of slew as well as resistive shielding of capacitance, thus yielding more accurate delays for both the interconnects and the source driver (transistor gate). In the system and method, a resistor-capacitor (RC) tree model is used for iterative calculations of effective capacitance and slew for each RC tree node. The effective capacitance is determined for each node by proceeding outward from the source to the sinks, and the slew for each node is determined, using the effective capacitances just determined, by proceeding inward from the sinks to the source node. Once the source node slew determined at a previous iteration is within a specified threshold of the source node slew in the present iteration, the method stops and stores the present iteration values as the final estimates.

20 Claims, 5 Drawing Sheets

SYSTEM AND METHOD FOR FAST INTERCONNECT DELAY ESTIMATION THROUGH ITERATIVE REFINEMENT

BACKGROUND OF THE INVENTION

1. Field of the Invention

This invention relates to a system and method of estimating time delay in integrated circuit design in general, and, in particular, to a system and method for estimating the interconnect delay in a Very Large System Integration (VLSI) circuit.

2. Description of the Related Art

VLSI circuits are commonplace in processor chips, whether for microprocessors, embedded devices, Digital Signal Processors (DSPs), etc. VLSI circuits are designed by groups of engineers who prepare detailed layout drawings, usually using Computer Aided Design (CAD) tools. These layouts macroscopically present the extremely complex pattern of active elements (such as transistors) and passive elements (such as interconnects) which, when photo-etched, doped, and deposited onto a silicon matrix, will collectively constitute the finished chip, which may include millions of microscopic parts, all interconnected according to a design.

The sequence of manufacturing steps required to produce such a VLSI chip in quantity is correspondingly complex. Thus, from initial design to setup of the manufacturing line, introduction of a new VLSI chip is an extremely expensive process, and not to be initiated lightly.

A major technical consideration underlying any new chip design is the maximum clock frequency at which the chip will operate in situ. If the frequency must, for the particular application, be greater that that at which a chip according to the particular design can operate, failure of the chip to function properly—or literal failure of the chip—can be the result.

It is important, therefore, in the process of designing a new chip or in implementing its manufacture, to determine, if possible, the maximum clock frequency at which the chip will operate. Obviously, if the maximum operating frequency can be determined at the analytical design point, before a significant investment in the manufacturing line has been made, a great deal of money can be saved by redesign, if the chip, when manufactured, will not operate properly at the frequency required. And even if, at a subsequent point in the process, the design must be altered—or even abandoned and replaced with an entirely new project—this might ultimately prove to be a prudent investment.

Additionally, although such cost savings can be easily appreciated in respect to a VLSI chip with millions of active components and interconnects, the potential savings which can thus be realized in the case of even a relatively simple Integrated Circuit (IC), incorporating only thousands of elements, can likewise be quite significant.

Therefore, there is a need to effectively determine, at a preliminary design phase, if possible, the extent to which a proposed chip—of whatever level of complexity—can be driven at or above the required clock frequency. This requires analysis of the time delay—from selected input to selected output points—of a signal input to the chip. In other words, it is necessary to determine the voltage response as a function of time.

One source of considerable transmission delay is the interconnects between active elements. Although it would be ideal if interconnects were loss-free—i.e., totally devoid of impedance—this is, unfortunately, not the case in the real world. Each interconnect does demonstrate a degree of resistance, capacitance, and, to a considerably lesser degree, inductance. While such impedance might be almost negligible in a single interconnect, even an extremely small value will have a significant effect on the maximum response speed of the circuit. Collectively, the delay caused by possibly millions of such interconnects will have a profound effect on reducing the maximum operating efficiency. In fact, interconnect delays represent an increasingly dominant portion of overall circuit delays in deep-submicron integrated circuit design.

Figure 1:
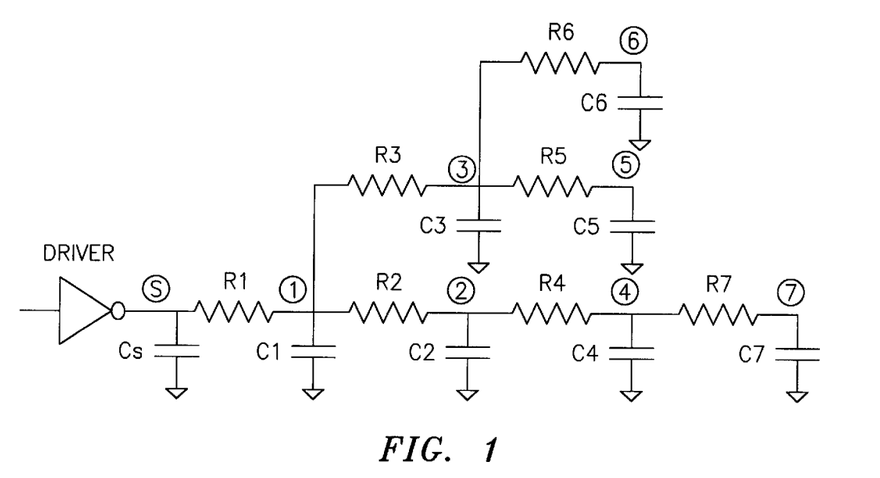
FIG. 1 is an exemplary RC tree representation of an interconnect section in an IC.

In order to effectively predict the effect of interconnect delay, several methods have been employed by circuit designers. Because an exact solution of the time delays in interconnects requires the solution of a set of complex differential equations, circuit designers rely upon simplifications and modeling to come up with timing estimates. A commonly used model represents interconnects as resistors and capacitances in series and parallel. This model produces an RC (Resistance-Capacitance) tree, as shown in FIG. 1.

An RC tree, or any net topology tree, is generated from a design model, a directed graph representing the "netlist" of the logic design. Each pin in an IC is associated with a "cell". Each cell has an associated location, the x,y coordinates of the cell in the IC. Also associated with each cell is physical information which provides the cell dimensions and the pin offsets relative to the cell origin. The cell location and pin offsets may be combined to determine the locations of each source and sink pin on a net. A net topology tree may then be generated from this data. The tree may be estimated using, for example, a minimum Steiner tree. Or, an actual or preferred wire route produced by a routing tool may be used. Once a tree has been generated, an interconnect delay estimator may use that tree to perform its calculations. C and R for each segment of the tree are computed using a set of technology constants specifying the capacitance and resistance per unit length. There may be only a single set of constants for all wires in any direction, or there may be different sets of constants for horizontal and vertical wires or for wires on different wiring planes.

Once an RC tree representation has been made, circuit designers use a simplified estimation metric to calculate the time delay. Among these simplified estimation metrics, the lumped RC delay and Elmore delay metrics are some of the most widely used techniques. These techniques will be described below.

Lumped RC Delay Model

The lumped RC delay model is a highly simplified estimation metric of the interconnect delay. It is well known that the response of a simple RC circuit to a step function is given as $V(t)=V_0(1-e^{-t/RC})$. This implies that the step input delay through the 50% point ($V_0/2$) of the output waveform for a simple RC circuit is given as 0.7*RC. This delay metric represents the time constant (0.7) obtained by multiplying the total wire resistance from source to sink with the total net capacitance (RC).

For example, for the RC tree shown in FIG. 1, total resistance from source S to node 7 is $R_1+R_2+R_4+R_7$ and the total lumped net capacitance is $C_{total}=(C_S+C_1+C_2+C_3+C_4+C_5+C_6+C_7)$. Thus, the interconnect delay from source S to node 7 according to lumped RC delay metric is given as $0.7*(R_1+R_2+R_4+R_7)*C_{total}$. Similarly, the lumped RC delay from source to various nodes is given as follows (where $T_{S-1}$ is the delay time from source S to node 1):

$$T_{S-1}=0.7*(R_1)*(C_{total})$$

$$T_{S-2}=0.7*(R_1+R_2)*(C_{total})$$

$$T_{S-3}=0.7*(R_1+R_3)*(C_{total})$$

$$T_{S-4}=0.7*(R_1+R_2+R_4)*(C_{total})$$

$$T_{S-5}=0.7*(R_1+R_3+R_5)*(C_{total})$$

$$T_{S-6}=0.7*(R_1+R_3+R_6)*(C_{total})$$

$$T_{S-7}=0.7*(R_1+R_2+R_4+R_7)*(C_{total})$$

Although the lumped RC delay model is computationally very efficient, it is highly inaccurate as compared to real interconnect delays.

Elmore Delay Model

One of the most popular delay metrics for RC trees has been the Elmore delay model because of its simplicity and high degree of correlation to real delays. Elmore originally estimated the 50% delay of a monotonic step response by the mean of the impulse response. W. C. Elmore, "The Transient Response of Damped Linear Networks with Particular Regard to Wide-band Amplifiers", *Journal of Applied Physics,* Vol.19, pp. 55–63, January 1948. Penfield and Rubenstein proved that the response of a general RC tree to a step input is monotonic. J. Rubinstein, Penfield, & M. A. Horowitz, "Signal Delay in RC tree networks", *IEEE Transactions on CAD,* Vol. 2, pp. 202–211, July 1983. They utilized the Elmore delay for obtaining bounds on the step response waveform of an RC tree. Under Elmore delay, the signal delay $T_{s-i}$ from source S to some node i in the interconnect RC tree is given as:

$$T_{s-i} = \sum_{over\_all\_nodes\_k} R_{k,i} C_k$$

where $C_k$ represents the capacitance at node k; and $R_{k,i}$ represents the summation of all the resistances that are common between the path from source S to node i, and the path from source S to node k. For example, in the interconnect RC tree in FIG. 1, $R_{6,3}$ is given by $R_1+R_3$.

Referring to the example RC interconnect tree shown in FIG. 1, the Elmore delay from the source S to various nodes in the RC tree is given as follows:

$$T_{S-1}=R_1*(C_1+C_2+C_3+C_4+C_5+C_6+C_7)$$

$$T_{S-2}=T_{S-1}+R_2*(C_2+C_4+C_7)$$

$$T_{S-3}=T_{S-2}+R_3*(C_3+C_5+C_6)$$

$$T_{S-4}=T_{S-2}+R_4*(C_4+C_7)$$

$$T_{S-5}=T_{S-3}+R_5*(C_5)$$

$$T_{S-6}=T_{S-3}+R_6*(C_6)$$

$$T_{S-7}=T_{S-4}+R_7*(C_7)$$

It is well known that computation of interconnect delays using the Elmore approach is very fast since it relies on single topological traversal of the interconnect tree. However, the Elmore model can result in highly inaccurate delays, especially in the case of deep-submicron designs where slews (or delay time) and resistive shielding have a significant effect on the interconnect delays.

Lastly, it should be noted that the Elmore delay represents the first moment of the impulse response, and that utilizing higher order moments can yield much better delay accuracy than the Elmore delay. For instance, Pillage et al. have utilized delay computation using higher order moments and moment-matching approximations to obtain more accurate delay estimates in RC trees. L. T. Pillage, R. A. Rohrer, "Asymptotic Waveform Evaluation for Timing Analysis", *IEEE Transactions* on CAD, Vol. 9, April 1990. Unfortunately, these delay estimations are computationally very intensive and require large run-times. Due to the high computational complexity of obtaining higher order moments and a lack of an accurate but efficient delay metric, the Elmore delay has remained a popular delay metric for higher levels of design stages.

Therefore, there is a need for a new computationally efficient and accurate calculation method and system for estimating delays in an IC using RC (i.e., interconnect) trees. Furthermore, there is a need for a estimation method and system which considers the effect of slew as well as resistive shielding of capacitance to yield more accurate delays for both the interconnects and the driver (transistor gate). Further still, there is a need for an estimation method and system which fulfills the above-mentioned needs and is computationally as efficient as the Elmore delay calculation.

SUMMARY OF THE INVENTION

An aspect of this invention is to provide a system and method for estimating interconnect delay times in an IC using an RC tree.

Another aspect of the invention is to provide a system and method for estimating interconnect delay times using an RC tree, where the system and method considers the effect of slew as well as the resistive shielding of capacitance.

Yet another aspect of the invention is to provide a system and a method for estimating interconnect delay times using an RC tree, where the system and method consider the effect of slew as well as the resistive shielding of capacitance, and further where the system and method are as efficient computationally as the Elmore delay method.

To accomplish the above and other aspects, a method and system are proposed, which, in the preferred embodiment, estimates interconnect delay in an Integrated Circuit (IC). First, a formula for effective capacitance is derived which considers the effect of slew as well as resistive shielding of capacitance, thus yielding more accurate delays for both the interconnects and the source driver (transistor gate). Next the system and method are described, where a resistor-capacitor (RC) tree model is used for iterative calculations of effective capacitance and slew for each RC tree node. The effective capacitance is determined for each node by proceeding outward from the source to the sinks, and the slew for each node is determined, using the effective capacitances just determined, by proceeding inward from the sinks to the source node. Once the source node slew determined at a previous iteration is within a specified threshold of the source node slew in the present iteration, the method stops and stores the present iteration values as the final estimates.

BRIEF DESCRIPTION OF THE FIGURES

The foregoing and other objects, aspects and advantages will be better understood from the following detailed description of preferred embodiment of the invention with reference to the following drawings.

DETAILED DESCRIPTION OF THE PREFERRED EMBODIMENTS

In the following description of the preferred embodiment of the present invention, many specific items are described, but these details are provided only for a complete understanding of the present invention, and thus it will be understood by those skilled in the art that the present invention can be performed without such specified items or with modifications thereof. Detailed descriptions of certain items that are well-known to one skilled in the art are omitted in order that the description of the preferred embodiment not be overwhelmed with irrelevant details.

The following description is broken into three sections: first, an equation for effective load capacitance is derived; second, an overview of the estimation method according to the preferred embodiment of the present invention is given; and, third, the estimation method of the second section is applied to FIG. 1.

Figure 5:
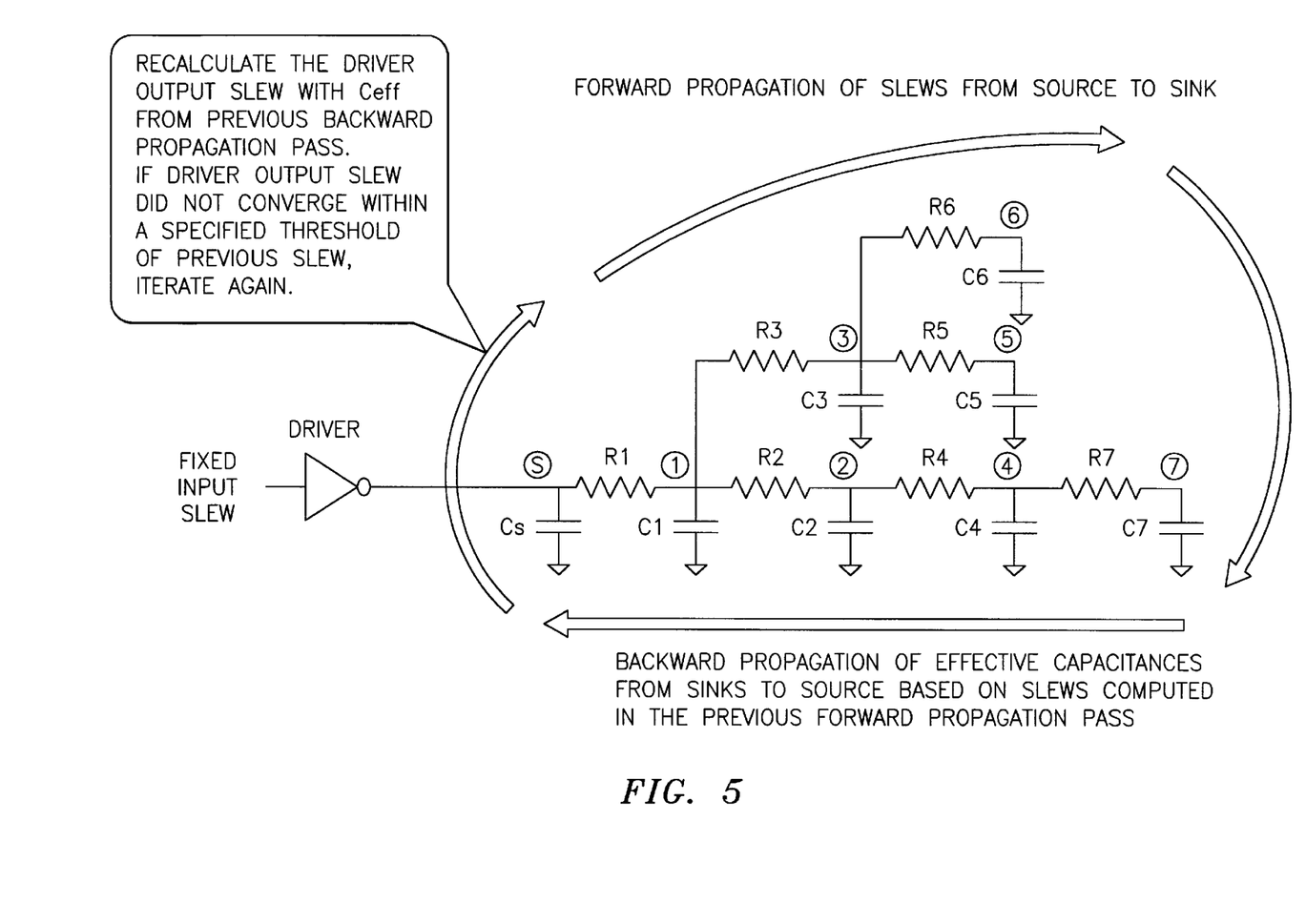
FIG. 5 is an exemplary diagram showing the steps of applying the iterative method to the RC tree of FIG. 1, according to the preferred embodiment of the present invention.

Computer system implementation of the method, which is rigorously described below, is believed to be well within the capability of a reasonably skilled computer programmer, in light of FIGS. 5 and 6 and the text referring thereto. However, it is also noted that the diagram in FIG. 5 and the flow chart in FIG. 6 could be altered, by a computer programmer of reasonable skill, in various ways to express the sequence of steps in carrying out the method of the present invention—without departing from the spirit and substance of the invention. It is suggested, therefore, that those seeking to practice the invention should feel free to generate a flow chart, or flow charts, which differ from those presented, as a prelude to preparation of a computer program designed to carry out the method according to these teachings.

I. Derivation of an Equation for Effective Load Capacitance

Figure 2:
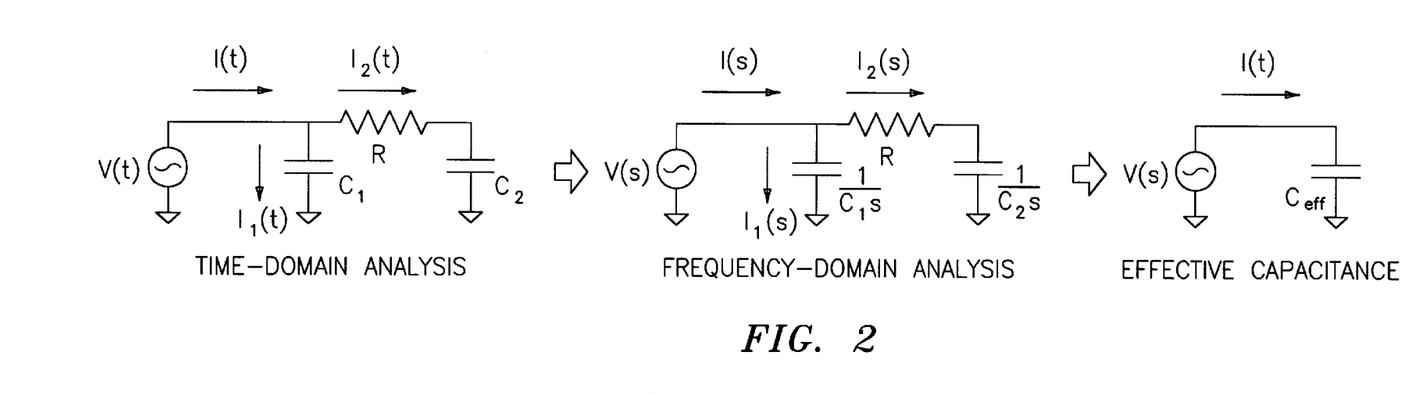
FIGS. 2 and 2a are diagrams showing the calculation of effective capacitance by using a transform from the time domain to the frequency domain.

First, an equation for effective load capacitance will be derived. In this derivation, the effect of slew and resistive shielding on load capacitance will be expressly considered (unlike the prior art methods). In FIG. 2, a simple model is given, in which a simple voltage source V(t) drives a Π-model RC-load $C_1$–R–$C_2$. On the left-hand side of FIG. 2, the problem is shown in the time domain. However, as indicated above, even in the simplest source and load impedance cases, computations of voltage response purely in the time domain involve very difficult numerical solutions of complex differential and integral equations. On the other hand, considering this problem in the frequency domain, as shown in the center of FIG. 2, transforms those complex differential and integral equations become straightforward linear equations, which are solvable in closed form.

Thus, the time domain problem can be transformed into a frequency domain problem by taking the Laplace transform of time domain equations, as is described below.

In the time domain, I(t) is the total current provided by voltage source V(t) and $I_1(t)$ is the current through $C_1$ and $I_2(t)$ be the current through R–$C_2$. In the following, simple analysis is performed in the frequency domain by taking the Laplace transform of current, voltage, and R, C values.

$$I_1(s) = \frac{V(s)}{1/C_1 s}, \quad I_2(s) = \frac{V(s)}{R + 1/C_2 s}$$

$$I(s) = V(s)\left(C_1 s + \frac{C_2 s}{1 + RC_2 s}\right)$$

Figure 2A:
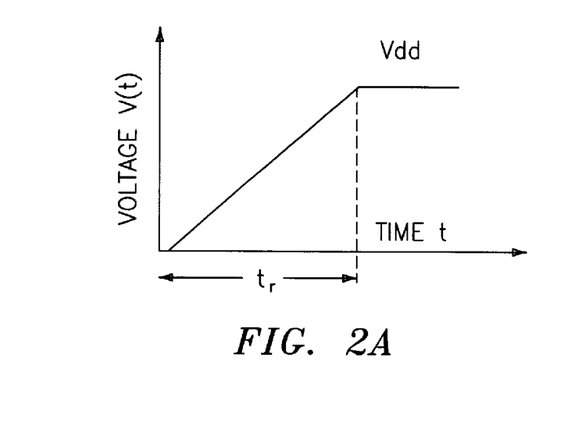

In this model, the voltage source V(t) is assumed to be a ramp voltage source with rise time, or slew, $t_r$, as shown in FIG. 2A. Thus, V(t) is given by:

$$V(t) = \frac{V_{dd}}{t_r} t$$

and the Laplace transform is:

$$V(s) = \frac{V_{dd}}{t_r} \frac{1}{s^2}$$

Substituting this in the current equation above:

$$I(s) = \frac{V_{dd}}{T_r}\left(\frac{C_1}{s} + \frac{C_2}{s(1 + RC_2 s)}\right)$$

$$I(s) = \frac{V_{dd}}{t_r}\left(\frac{C_1 + C_2}{s} - \frac{C_2}{s + \frac{1}{RC_2}}\right)$$

$$I(t) = \frac{V_{dd}}{t_r}\left((C_1 + C_2) - C_2 e^{-\frac{t}{RC_2}}\right)$$

We are interested in calculating the effective capacitance as seen by the voltage source (V(t)), rather than the total lumped capacitance $C_1+C_2$. For this purpose, the effective capacitance $C_{\mathit{eff}}$ is defined to be a capacitance that will result in the same 50% delay[1] as the Π model load. To find the effective capacitance $C_{\mathit{eff}}$, we calculate the capacitance that requires the same charge transfer "Q" as that required by the π model load up to 50% delay point (i.e., the time when the input reaches $V_{DD}/2$, i.e., $t=t_r/2$).

[1] 50% delay is defined as the time elapsed between when the input voltage reaches $V_{DD}/2$ and when the output voltage reaches the same voltage $V_{DD}/2$.

$$Q = \int_0^{t_r/2} I(t)dt = \int_0^{t_r/2} \frac{V_{dd}}{T_r}\left((C_1 + C_2) - C_2 e^{-\frac{t}{RC_2}}\right)dt = \frac{C_{\mathit{eff}} V_{dd}}{2}$$

$$\frac{V_{dd}(C_1 + C_2)}{2} - \frac{RC_2^2 V_{dd}}{t_r}\left(1 - e^{-\frac{t_r}{2RC_2}}\right) = \frac{C_{\mathit{eff}} V_{dd}}{2}$$

$$C_{\mathit{eff}} = C_1 + C_2\left(1 - \frac{2RC_2}{t_r}\left(1 - e^{-\frac{t_r}{2RC_2}}\right)\right)$$

This can be simplified to the form:

$$C_{\mathit{eff}} = C_1 + C_2 * K,$$

where K is the capacitance shielding factor, which is defined as:

$$K = \left(1 - 2x\left(1 - e^{-\frac{1}{2x}}\right)\right)$$

where $$x = \frac{RC_2}{t_r}$$

Figure 3:
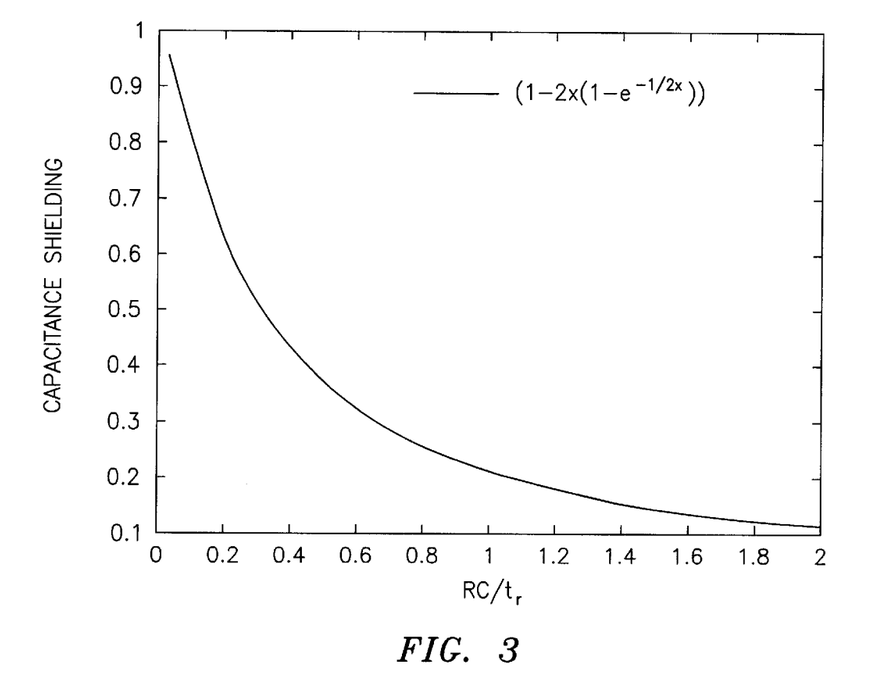
FIG. 3 is a graph of capacitance shielding factor K versus the RC time constant divided by the slew $t_r$, according to the preferred embodiment of the present invention.

Thus, capacitance shielding factor K depends on the time constant $RC_2$ and the input slew $t_r$. It is possible for the capacitance $C_2$ to be shielded by a significant amount depending on the relative values of $RC_2$ and slew $t_r$, as shown in FIG. 3.

II. An Overview of the Delay Estimation Using Iterative Refinement Method According to the Preferred Embodiment of the Present Invention In the preferred embodiment, the equation derived above is used in iterative delay estimation by traversing a simple RC tree topology. Obviously, the interconnect delay estimation system and method described below assumes that the RC tree has already been generated, and the interconnect delay estimation system and method uses that tree to perform its forward and backward propagations.

In practice, the voltage source V(t) driving the RC tree in FIG. 1 is a CMOS (Complementary Metal Oxide Semiconductor) gate. Since the slew at the output of the gate (i.e., input of RC-tree) is not known in the beginning (because it, in turn, depends on the effective capacitance), the value of $C_{eff}$ is solved with the driver slew equation. In standard cell based designs, the delay and slew at the output of a given cell is predefined in the timing rules in terms of its input slew and output load capacitance. Thus, the output slew $t_r$ of the driver is expressed as a function of the input slew to the driver and $C_{eff}$. Since, in analysis, the input slew at the gate remains the same, output slew depends only on output capacitance. This interdependence of slew and effective capacitance is utilized in order to provide an iterative method for determining interconnect delays. In this iterative method, the delay estimates are iteratively refined by repeated forward and backward traversals of the RC tree topology.

Figure 6:
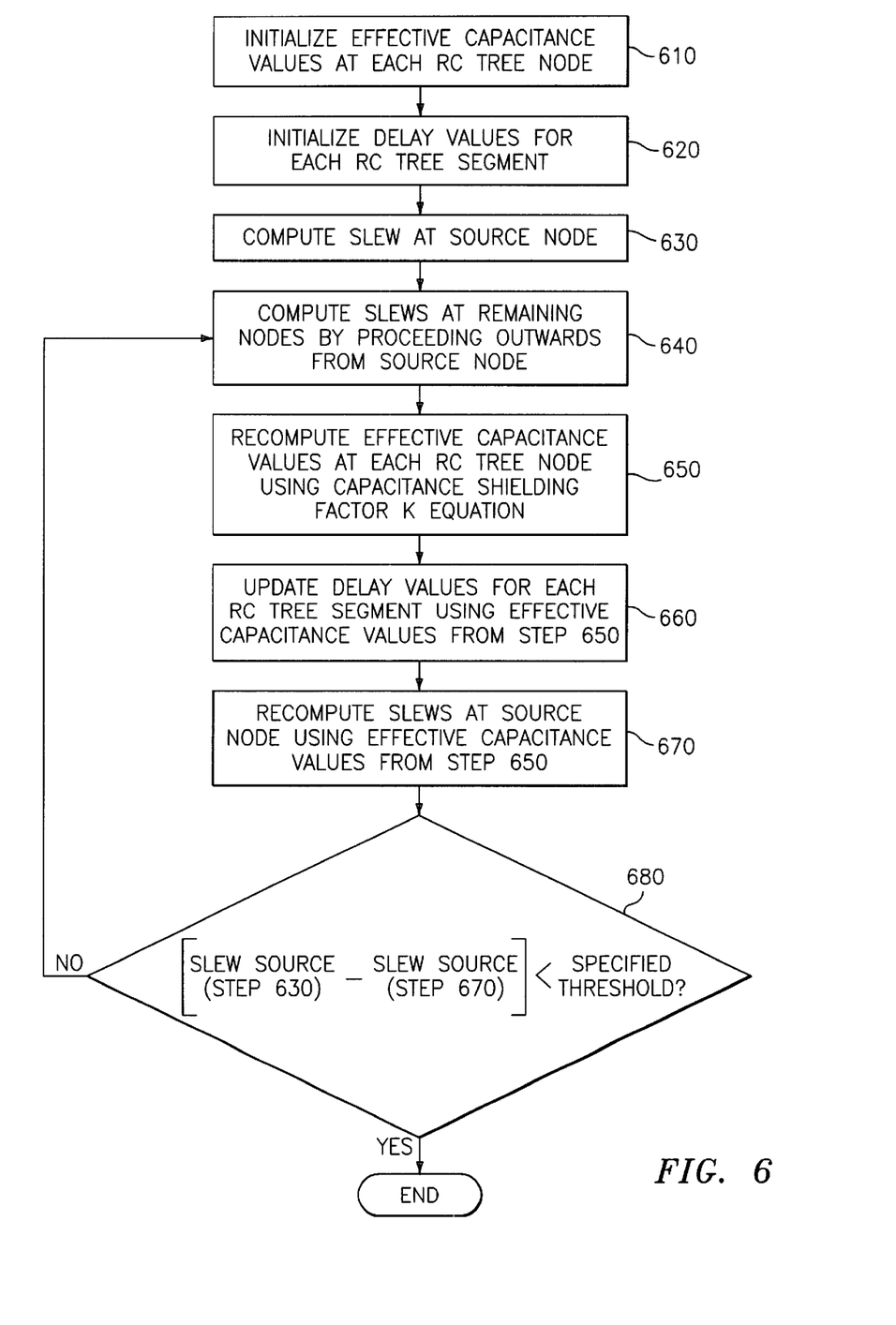
FIG. 6 is a flowchart of a time delay estimation method according to the preferred embodiment of the present invention.

As shown in FIG. 6, the outline of the iterative refinement method for estimating interconnect delays is as follows:

1. Initialize the effective capacitance of each RC tree node i (i.e., $C_{eff}(i)$) with the sum of all downstream capacitances (Step 610).
2. Initialize the delay on each RC-tree segment with corresponding Elmore delays (Step 620).
3. Compute the slew at the source of RC-tree, i.e., output of driver with last computed $C_{eff}$ (source) (Step 630).
4. Calculate the slews of each RC tree segment, by moving outward from the source node towards the sinks (Step 640) using by the following formula:

$$slew_i = slew_{father} + T_{father-i}$$

where $T_{father-i}$=Elmore delay between father and node "i"

This formula relates the input slew of a simple RC-segment in a RC-tree with its output slew and has the following simple basis.

Figure 4:
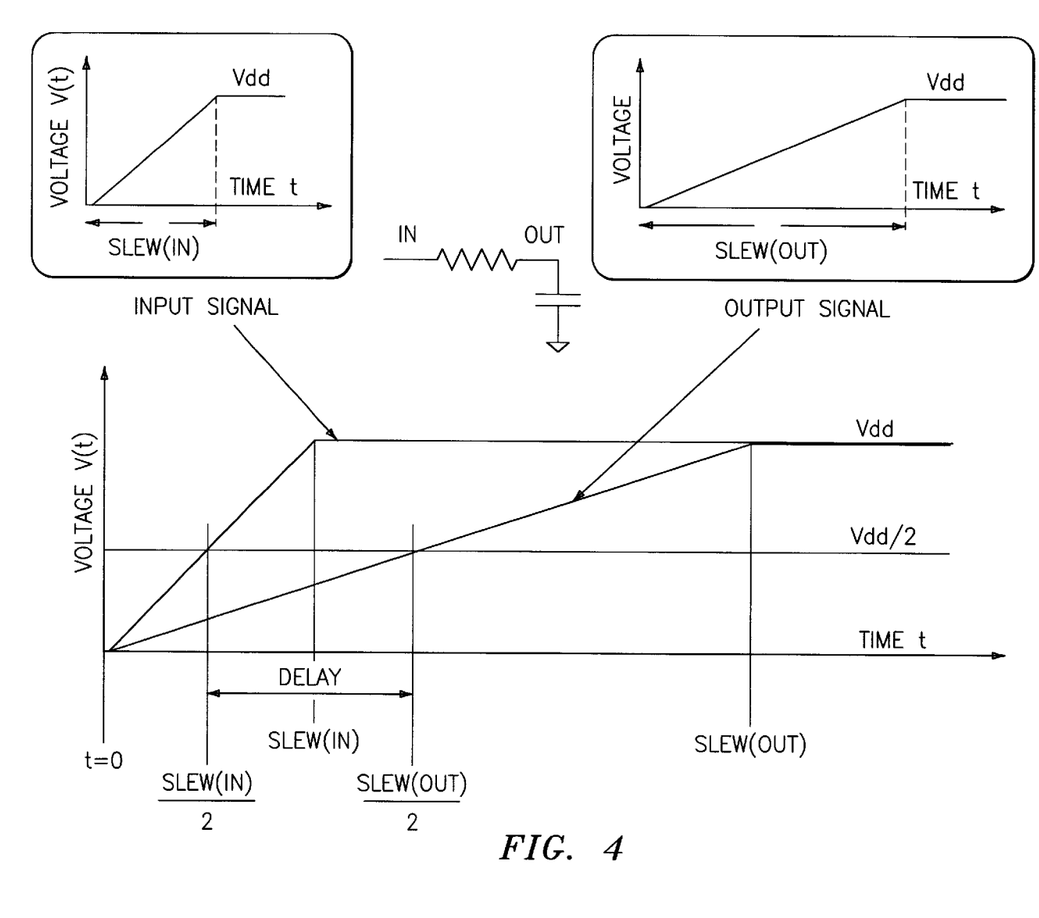
FIG. 4 is a diagram comparing the input slew time and output slew time of a simple RC tree segment.

In contrast to active elements, such as transistors, passive elements in interconnects, such as resistors and capacitors, exhibit no internal delay. Thus, the output waveform is assumed to follow the input waveform without any delay although at a much slower pace. This is illustrated in FIG. 4, where the output waveform begins to rise at the same time as the input waveform, but the slope of the rise is much less steep. Thus, as shown in FIG. 4, the output slew through a simple RC circuit can be estimated from the input slew and the 50% delay across the RC circuit (given by 0.7RC) as follows:

$$slew_{out} slew_{in} + 2 * T_{in-out}$$

where $T_{in-out}$=Elmore delay between input and output node

Although this relationship may be an oversimplification, in other embodiments, it can easily be substituted by other analytical equations.

5. Recalculate the effective capacitance of each node starting from the sinks and traversing backwards towards the source (Step 650). The effective capacitance is calculated by using the capacitance shielding factor as derived above.
6. Update the Elmore delay values of each RC-tree segment using new effective capacitance values (step 660).
7. Recalculate the driver output slew (Step 670) using the effective load capacitance determined in the previous backward propagation pass (i.e., Step 650). If driver slew did not converge within a specified threshold of previous slew (as determined in Step 680), iterate over step 4 to step 7 again until the slew at the drive output converges (repeat Steps 640–680).

In the preferred embodiment of the system and method, these steps are implemented in a computer implementation, but there might, theoretically, be other implementations. In the computer program implementing the system and method according to the preferred embodiment, the code provides two interfaces to a timer in a CAD modeling tool. One interface returns the net capacitance; the other interface returns the net delay between a given source and sink. It is important for efficiency that the full iterative calculation be done only one time unless the net topology changes. This is managed by a caching mechanism discussed below. If valid cached values are available, no calculation takes place. Otherwise, the net topology tree is generated, and the interconnect delay estimation computation is performed. The requested data, either net capacitance ($C_{eff}$ in this case) or source-to-sink delay, is returned to the timer.

It is important for efficiency to store the calculated results in order to eliminate redundant calculations, even though the system and method according to the preferred embodiment is significantly faster than other accurate methods. The data cached in the preferred embodiment are the net capacitance ($C_{eff}$) and the net delay for each sink pin. This data is stored as attributes or keywords on various objects in the design model. Net capacitance is stored on the nets, while delays and locations are stored on the pins. Callback functions are registered with the RC tree model such that any changes to the design structure which potentially affect this data result in a callback function being called. The callback functions invalidate the affected cached data such that any subsequent request for these data will result in recalculation of the data. The net topology tree information is not cached since it is used only during the interconnect delay estimation calculation step.

III. An Example of the Delay Estimation Method According to the Preferred Embodiment of the Present Invention An example of this iterative refinement method for interconnect delay estimation is applied to the interconnect RC tree of FIG. 1, and is illustrated in FIG. 5.

Given the interconnect RC tree topology with a gate driver as shown in FIG. 1, the effective capacitance at every node of the RC tree is set initially to be the sum of all downstream capacitances. Thus, in the example RC tree, the effective capacitances at various nodes are initialized as:

$$C_{eff}(S) = (C_S + C_1 + C_2 + C_3 + C_4 + C_5 + C_6 + C_7)$$

$$C_{eff}(1) = (C_1 + C_2 + C_3 + C_4 + C_5 + C_6 + C_7)$$

$C_{eff}(2)=(C_2+C_4+C_7)$ $C_{eff}(3)=(C_3+C_5+C_6)$ $C_{eff}(4)=(C_4+C_7)$ $C_{eff}(5)=(C_5)$ $C_{eff}(6)=(C_6)$ $C_{eff}(7)=(C_7)$ In addition, the various RC tree segments are initialized with Elmore delays $T_{s-1}, T_{1-2}, T_{1-3}, T_{2-4}, T_{3-5}, T_{3-6}, T_{4-7})$ by using the effective capabilities derived above.

$T_{s-1}=R_1*C_{eff}(1)$ $T_{1-2}=R_2*C_{eff}(2)$ $T_{1-3}=R_3*C_{eff}(3)$ $T_{2-4}=R_4*C_{eff}(4)$ $T_{3-5}=R_5*C_{eff}(5)$ $T_{3-6}=R_6*C_{eff}(6)$ $T_{4-7}=R_7*C_{eff}(7)$ Then the slew at the source node "S" is calculated by considering the driver slew equation. It is assumed that the driver is characterized by output slew=f(input slew, load). Then we calculate the slew at node S (i.e., slew$_S$) by substituting for the load with $C_{eff}(1)$ in the driver slew equation. After determining the initial slew slew$_S$ at source node S, slews are calculated for each RC tree node by moving outward from the source node to the sinks in a levelized traversal (i.e., in order S, 1, 2, 3, 4, 5, 6, 7) as follows:

First, node 1's signal slew is determined as slew$_1$=slew$_S$+ 2*T$_{S-1}$. Based on node 1's slew, the slews at node 2 and node 3 is computed:

slew$_2$=slew$_1$+2*T$_{1-2}$ slew$_3$=slew$_1$+2*T$_{1-3}$

Then, proceeding outward from nodes 2 and 3, the slews at nodes 4, 5, and 6 are determined:

slew$_4$=slew$_2$+2*T$_{2-4}$ slew$_5$=slew$_3$+2*T$_{3-5}$ slew$_6$=slew$_3$+2*T$_{3-6}$ Lastly, the slew at node 7 is determined:

slew$_7$=slew$_4$+2*T$_{4-7}$

After the forward slew propagation phase, the new effective capacitance values for each node are recalculated based on these slew values. This is done by proceeding backward from the sinks towards sources (i.e., in order 7.6, 5.4, 3, 2, 1, S). For a sink node, the effective capacitance is always the same as the node capacitance.

$C_{eff}(7)=C_7$ $C_{eff}(6)=C_6$ $C_{eff}(5)=C_5$ $C_{eff}(4)=C_4+K_7*C_{eff}(7)$ $C_{eff}(3)=C_3+K_5*C_{eff}(5)+K_6*C_{eff}(6)$ $C_{eff}(2)=C_2+K_4*C_{eff}(4)$ $C_{eff}(1)=C_1+K_2*C_{eff}(2)+K_3*C_{eff}(3)$ $C_{eff}(S)=C_S+K_1*C_{eff}(1)$ where $K_i$ denotes the capacitance shielding factor for node i and, as shown before, it is calculated as:

$$K_i = \left(1 - 2x_i\left(1 - e^{-\frac{1}{2x_i}}\right)\right)$$

where:

$$x_i = \frac{R_i C_{eff}(i)}{t_{ri}}$$

$R_i$ is the resistance connected between node i and its father node, $t_r$ denotes the slew at input at resistance $R_i$ (i.e., at father node). $C_{eff}(i)$ denotes the effective capacitance at node i.

After the backward traversal of the RC tree to determine the respective effective capacitance values, the Elmore delays ($T_{s-1}, T_{1-2}, T_{1-3}, T_{2-4}, T_{3-5}, T_{3-6}, T_{4-7}$) of each RC-tree segment are updated using the new effective capacitance values.

The slew at the driver gate output is recalculated (i.e., source node S of RC tree) using the newly calculated effective capacitance at node S. The process of forward propagation of slew and backward propagation of effective capacitances is iterated until the slew value at S differs by less than a user defined threshold from the previous slew value. Once that threshold is reached, the final delay and effective capacitance values on the interconnect RC-tree have been obtained.

While the present invention has been described with respect to certain preferred embodiments, it should be understood that the invention is not limited to these particular embodiments, but, on the contrary, the invention is intended to cover all modifications, equivalents, and alternatives falling within the spirit and scope of the invention as defined by the appended claims.

What is claimed is:

1. A method for estimating the interconnect delay times in an integrated circuit using a resistor-capacitor (RC) tree model, comprising the steps of:

a) initializing an effective capacitance for each RC tree node;

b) initializing a delay on each RC tree segment;

c) computing slew at a source node of the RC tree, using an effective capacitance last calculated for the source node;

d) computing remaining slews for each node in the RC tree by propagating outward to sinks from the source;

e) recomputing effective capacitances for each RC tree node by propagating inward to the source node from the sinks;

f) updating the delay of each RC tree segment using effective capacitances recomputed in step (e);

g) recomputing the source node slew using an effective capacitance recomputed in step (e); and h) repeating steps (d) to (h) until the source node slew computed at step (c) is within a specified threshold from the source node slew recomputed at step (g).

2. The method as recited in claim 1, wherein each initial effective capacitance in step (a) is a sum of all capacitances downstream from said RC node.

3. The method as recited in claim 1, wherein each initial delay in step (b) and each updated delay in step (f) is a corresponding Elmore delay.

4. The method as recited in claim 1, wherein the slew function used in step (c) is a driver slew equation that depends only on output capacitance.

5. The method as recited in claim 1, wherein each remaining slew(i) is calculated in step (d) using the following equation:

$$slew_i = slew_{father} + T_{father-i}$$

where $slew_i$=slew at node (i);

where $slew_{father}$=slew at node (father), said node(father) being adjacent to said node(i) and lying between node (i) and the source node; and where $T_{father-i}$=Elmore delay between node (father) and node (i).

6. The method as recited in claim 1, wherein recomputing step (e) uses a capacitance shielding factor for each node.

7. The method as recited in claim 6, wherein the capacitance shielding factor K for a node(j) is determined by the following equation:

$$K_j = \left(1 - 2x_j\left(1 - e^{-\frac{1}{2x_j}}\right)\right)$$

where:

$$x_j = \frac{R_j C_j}{t_r}$$

wherein a node(i) is adjacent to node(j) and between node(j) and the source node;

where $R_j$ is the resistance between node(j) and node(i);

where $C_j$ is the capacitance adjacent to node(j); and where $t_r$ is the slew of a ramp input voltage at node(i).

8. The method as recited in claim 1, wherein recomputing step (e) uses the following equation at tree node i:

$$C_{eff} = C_i + \sum_{over\_all\_nodes\_j} C_j K_j$$

where $C_i$ is the capacitance adjacent to node(i);

where $C_j$ is an effective capacitance of an RC tree node(j) adjacent to node(i) in the direction of a sink;

where $K_j$ is the capacitance shielding factor at node(j), which is defined as:

$$K_j = \left(1 - 2x_j\left(1 - e^{-\frac{1}{2x_j}}\right)\right)$$

where $$x_j = \frac{R_j C_j}{t_r}$$

wherein a node(i) is adjacent to node(j) and between node(j) and the source node;

where $R_j$ is the resistance between node(j) and node(i);

where $C_j$ is the capacitance adjacent to node(j); and where $t_r$ is the slew of a ramp input voltage.

9. A method for estimating interconnect delay times in an integrated circuit using an initialized resistor-capacitor (RC) tree model, comprising iteratively performing at least the following steps:

a) computing slews for each RC tree node, starting from a source node and proceeding outward to sinks, and using current values for effective capacitance, each of said current values being an initialized value or an updated value, said current values being determined during the current iteration; and b) computing updated effective capacitances for each RC tree node using a capacitance shielding factor, starting at the sinks and proceeding inward to the source node;

wherein steps (a) and (b) are iteratively repeated until the source node slew calculated using the updated respective effective capacitance is within a specified threshold from the source node slew computed at a previous iteration of step (b);

wherein the capacitance shielding factor K for a node(j) is determined by the following equation:

$$K_j = \left(1 - 2x_j\left(1 - e^{-\frac{1}{2x_j}}\right)\right) \quad \text{where:} \quad x_j = \frac{R_j C_j}{t_r}$$

wherein a node(i) is adjacent to node(j) and located between node (j) and the source node, and further wherein:

$R_j$ is the resistance between node(j) and node(i), $C_j$ is the capacitance adjacent to node(j), and $t_r$ is the slew of a ramp input voltage at node(i).

10. A method for estimating the interconnect delay times in an integrated circuit using a resistor-capacitor (RC) tree model, comprising the steps of:

a) initializing an effective capacitance for each RC tree node with a sum of all downstream capacitances;

b) initializing a delay on each RC tree segment with a corresponding Elmore delay;

c) computing slew at a source node of the RC tree, using an effective capacitance last calculated for the source node;

d) computing remaining slews in the RC tree by propagating outward to sinks from the source, using the following equation:

$$slew_i = slew_{father} + T_{father-i}$$

where $slew_i$=slew at node (i);

where $slew_{father}$=slew at node (father), said node (father) being adjacent to said node(i) and lying between node(i) and the source node; and where $T_{father-i}$=Elmore delay between node (father) and node (i);

e) recomputing effective capacitances for each RC tree node by propagating inward to the source node from the sinks, said re-computation using a capacitance shielding factor for each node, using the following equation at tree node i:

$$C_{eff} = C_i + \sum_{over\_all\_nodes\_j} C_j K_j$$

where $C_i$ is the capacitance adjacent to node(i);
where $C_j$ is an effective capacitance of an RC tree node(j) adjacent to node(i) in the direction of a sink;
where $K_j$ is the capacitance shielding factor at node(j), which is defined as:

$$K_j = \left(1 - 2x_j\left(1 - e^{-\frac{1}{2x_j}}\right)\right)$$

where $$x_j = \frac{R_j C_j}{t_r}$$

wherein a node(i) is adjacent to node(j) and between node(j) and the source node;
where $R_j$ is the resistance between node(j) and node(i);
where $C_j$ is the capacitance adjacent to node(j); and
where $t_r$ is the slew of a ramp input voltage;

f) updating the Elmore delay of each RC tree segment using effective capacitances recomputed in step (e); and
g) recomputing the source node slew using an effective capacitance recomputed in step (e); and
h) repeating steps (d) to (h) until the source node slew computed at step (c) is within a specified threshold from the source node slew recomputed at step (g).

11. A computer system for estimating the interconnect delay times in an integrated circuit using a resistor-capacitor (RC) tree model, the computer system comprising:
at least one computer-readable medium including:
code that initializes an effective capacitance for each RC tree node;
code that initializes a delay on each RC tree segment;
code that computes a slew at a source node of the RC tree, using an effective capacitance last calculated for the source node;
code that computes remaining slews for each node in the RC tree by propagating outward to sinks from the source;
code that recomputes effective capacitances for each RC tree node by propagating inward to the source node from the sinks;
code that updates the delay on each RC tree segment using effective capacitances recomputed by the code that recomputes the effective capacitances;
code that recomputes the source node slew using an effective capacitance recomputed by the code that recomputes the effective capacitances; and
code that iterates through the code that computes the source node slew, the code that recomputes the effective capacitances, and code that recomputes the source node slew until the source node slew computed by the code that computes the source node slew is within a specified threshold from the source node slew recomputed by the code that recomputes the source node slew.

12. The computer system as recited in claim 11, wherein the code that initializes an effective capacitance for each RC tree node uses a sum of all capacitances downstream from said each RC node.

13. The computer system as recited in claim 11, wherein the code that initializes a delay on each RC tree segment and the code that updates the delay on each RC tree segment uses a corresponding Elmore delay.

14. The computer system as recited in claim 11, wherein the code that computes a slew at a source node of the RC tree, uses a driver slew equation that depends only on output capacitance.

15. The computer system as recited in claim 11, wherein the code that computes remaining slews for each node in the RC tree by propagating outward to sinks from the source uses the following equation:

$$slew_i = slew_{father} + T_{father-i}$$

where $slew_i$=slew at node (i);
where $slew_{father}$=slew at node (father), said node(father) being adjacent to said node(i) and lying between node (i) and the source node; and
where $T_{father-i}$=Elmore delay between node (father) and node (i).

16. The computer system as recited in claim 11, wherein the code that recomputes effective capacitances for each RC tree node by propagating inward to the source node from the sinks uses a capacitance shielding factor for each node.

17. The computer system as recited in claim 16, wherein the capacitance shielding factor K for a node(j) is determined by the following equation:

$$K_j = \left(1 - 2x_j\left(1 - e^{-\frac{1}{2x_j}}\right)\right)$$

where:

$$x_j = \frac{R_j C_j}{t_r}$$

wherein a node(i) is adjacent to node(j) and between node(j) and the source node;
where $R_j$ is the resistance between node(j) and node(i);
where $C_j$ is the capacitance adjacent to node(j); and
where $t_r$ is the slew of a ramp input voltage at node(i).

18. The computer system as recited in claim 11, wherein the code that recomputes effective capacitances for each RC tree node by propagating inward to the source node from the sinks uses the following equation at tree node i:

$$C_{eff} = C_i + \sum_{over\_all\_nodes\_j} C_j K_j$$

where $C_i$ is the capacitance adjacent to node(i);
where $C_j$ is an effective capacitance of an RC tree node(j) adjacent to node(i) in the direction of a sink;
where $K_j$ is the capacitance shielding factor at node(j), which is defined as:

$$K_j = \left(1 - 2x_j\left(1 - e^{-\frac{1}{2x_j}}\right)\right)$$

where $$x_j = \frac{R_j C_j}{t_r}$$

wherein a node(i) is adjacent to node(j) and between node(j) and the source node;

where $R_j$ is the resistance between node(j) and node(i);
where $C_j$ is the capacitance adjacent to node(j); and
where $t_r$ is the slew of a ramp input voltage.

19. A computer system for estimating interconnect delay times in an integrated circuit using an initialized resistor-capacitor (RC) tree model, the computer system comprising:
   at least one computer-readable medium, said medium including computer-readable program code for iteratively performing the following:
      a) computing slews for each RC tree node, starting from a source node and proceeding outward to sinks, and using current values for effective capacitance, each of said current values being an initialized value or an updated value, said current values being determined during the current iteration; and
      b) computing updated effective capacitances for each RC tree node using a capacitance shielding factor, starting at the sinks and proceeding inward to the source node;
   wherein steps (a) and (b) are iteratively repeated until the source node slew calculated using the updated respective effective capacitance is within a specified threshold from the source node slew computed at a previous iteration of step (b);
   wherein the capacitance shielding factor K for a node(j) is determined by the following equation:

$$K_j = \left(1 - 2x_j\left(1 - e^{-\frac{1}{2x_j}}\right)\right) \quad \text{where: } x_j = \frac{R_j C_j}{t_r}$$

wherein a node(i) is adjacent to node(j) and between node(j) and the source node, and further wherein:
   $R_j$ is the resistance between node(j) and node(i),
   $C_j$ is the capacitance adjacent to node(j), and
   $t_r$ is the slew of a ramp input voltage at node(i).

20. A computer system for estimating the interconnect delay times in an integrated circuit using a resistor-capacitor (RC) tree model, the computer system comprising:
   at least one computer-readable medium including:
      code that initializes an effective capacitance for each RC tree node with a sum of all downstream capacitances;
      code that initializes a delay on each RC tree segment with a corresponding Elmore delay;
      code that computes a slew at a source node of the RC tree;
      code that computes remaining slews for each node in the RC tree by propagating outward to sinks from the source, using the following equation:

$$\text{slew}_i = \text{slew}_{father} + T_{father-i}$$

where $\text{slew}_i$=slew at node (i);
      where $\text{slew}_{father}$=slew at node (father), said node (father) being adjacent to said node(i) and lying between node(i) and the source node; and
      where $T_{father-i}$=Elmore delay between node (father) and node (i);
      code that recomputes effective capacitances for each RC tree node by propagating inward to the source node from the sinks, said re-computation using a capacitance shielding factor for each node, using the following equation at tree node i:

$$C_{eff} = C_i + \sum_{over\_all\_nodes\_j} C_j K_j$$

where $C_i$ is the capacitance adjacent to node(i);
      where $C_j$ is an effective capacitance of an RC tree node(j) adjacent to node(i) in the direction of a sink;
      where $K_j$ is the capacitance shielding factor at node (j), which is defined as:

$$K_j = \left(1 - 2x_j\left(1 - e^{-\frac{1}{2x_j}}\right)\right)$$

where $$x_j = \frac{R_j C_j}{t_r}$$

wherein a node(i) is adjacent to node(j) and between node(j) and the source node; where $R_j$ is the resistance between node(j) and node(i);
      where $C_j$ is the capacitance adjacent to node(j); and
      where $t_r$ is the slew of a ramp input voltage;
      code that updates the delay at each RC tree segment using effective capacitances recomputed by the code that recomputes the effective capacitances;
      code that recomputes the source node slew using an effective capacitance recomputed by the code that recomputes the effective capacitances; and
      code that iterates through the code that computes the source node slew, the code that recomputes the effective capacitances, and code that recomputes the source node slew until the source node slew computed by the code that computes the source node slew is within a specified threshold from the source node slew recomputed by the code that recomputes the source node slew.

* * * * *